Sept. 16, 1969 E. GLAZEBROOK ET AL 3,467,838

ELECTRIC PULSE DELAY CIRCUIT

Filed Sept. 2, 1965 2 Sheets-Sheet 1

ELECTRIC PULSE DELAY CIRCUIT

Filed Sept. 2, 1965 2 Sheets-Sheet 2

United States Patent Office 3,467,838
Patented Sept. 16, 1969

3,467,838
ELECTRIC PULSE DELAY CIRCUIT

Ellis Glazebrook, Ulverston, and Kenneth Duncan Fraser Chisholm, Kidsgrove, Stoke-on-Trent, England, assignors to English Electric Computers Limited, London, England, a British company Filed Sept. 2, 1965, Ser. No. 484,671
Claims priority, application Great Britain, Sept. 3, 1964, 36,202/64
Int. Cl. H03k 5/159
U.S. Cl. 307—268 8 Claims

ABSTRACT OF THE DISCLOSURE

The specification discloses an electric pulse delay circuit having an input circuit (base of transistor 25) supplied with input pulses by an AND/OR gate, and with clock pulses by a source 31, and an output circuit (tapping of emitter load resistor 42 of transistor 26) which supplies output pulses each of which occurs one time period later than the corresponding input pulse giving rise to it.

During the simultaneous presence of an input pulse and a clock pulse (the latter occurs only during the last 40% of each time period) energy is stored in the inductive winding 34, and this energy is subsequently dissipated from winding 35 at the end of the clock pulse when transistor 25 turns non-conductive, by the flow of current into the clock pulse source 31, the capacitor 41 and the collector and emitter circuits of transistor 26. Increased conduction of this transistor starts the output pulse. This secondary winding current flow ceases before the clock pulse in the next time period terminates and the capacitor 41 then maintains transistor 26 conductive until the end of this second-mentioned clock pulse, at which time the clock pulse source discharges the capacitor 41 rapidly and alters the conduction in transistor 26 to terminate the output pulse.

Transistors 45 and 46 driven from the emitter load tapping 42 provide COMPLEMENT and TRUE output signals.

This invention relates to an electric pulse delay and regeneration circuit for receiving electric input pulses which occur randomly during successive equal time periods and which are substantially coextensive in time with the corresponding time periods in which they occur, and for producing in response to each such input pulse a corresponding electric output pulse occurring in the next succeeding time period.

Such electric circuits are employed, for example, in electronic digital computer logic systems, and serve to provide means for enabling degeneration in the form of the input pulses to be reduced to a low level. Without such circuits pulses passing through several successive logic stages would suffer progressive degeneration in form, with the consequence that apparatus receiving such degenerated pulses may fail to respond to them in the desired manner.

In the prior art such circuits have required in addition to the use of clock pulses, other pulse trains of special form to effect the desired delay and regeneration of input pulses.

The present invention is directed at the provision of an electric pulse delay and regeneration circuit which requires no such pulse trains of special form.

According to one feature of the present invention an electric pulse delay and regeneration circuit includes a clock pulse generator for producing in the later part only of each time period an electric clock pulse of constant duration and magnitude, an energy receiving circuit including in series a controllable switching means and an inductive device, a control means responsive to both the said input pulses and the said clock pulses for producing only in the simultaneous presence of pulses of both kinds a control signal for rendering the controllable switching means conductive whereby to build up a magnetic field in the inductive device, an energy dissipating means for enabling the energy stored in the magnetic field in the inductive device at the end of a clock pulse to be dissipated before the end of the clock pulse occurring in the next succeeding time period, this dissipating means including a dissipating circuit which includes a coupling means for enabling the transfer of energy from the inductive device into the dissipating circuit, and means for preventing the potential developed across the dissipating circuit fom exceeding a substantially constant predetermined first level during the dissipation of the energy, energy storage means connected with the dissipating circuit for receiving energy at the said substantially constant potential at the start of the period of dissipating the energy from the inductive device, discharging means including a capacitor and a diode device in series relationship for supplying the clock pulses to the dissipating circuit in such a manner that at the end of each clock pulse, and time period, any energy stored in the said energy storage means is discharged rapidly whereby to change the potential developed across the dissipating circuit to a substantially constant predetermined second level in the absence of any other dissipation of energy from the inductive device consequent upon the occurrence of another input signal, and output circuit means for deriving from the dissipating circuit potential an output potential pulse corresponding to, but having a standardised form compared with, the input pulse which gave rise to it.

Preferably, the inductive device includes a magnetic core and a primary winding carried thereby, this winding being connected in series with the controllable switching means for supply from suitable potential tappings of a D.C. supply source, and the said coupling means comprises a secondary winding carried on the magnetic core of the inductive device and connected in the dissipating circuit.

According to another feature of the present invention the said means for preventing the potential developed across the dissipating circuit from exceeding the said first level comprises a diode element for connecting the dissipating circuit to an appropriate potential tapping of the said D.C. supply source.

The diode element is preferably constituted by the base collector junction of a transistor, and in such a case the output circuit means may include an electric circuit including an impedance for connecting the emitter of the transistor with an appropriate potential tapping of the D.C. supply source, and a tapping for deriving from this emitter circuit the said output pulses.

The controllable switching means may comprise a transistor, and in such a case the said control means may comprise a base control circuit for receiving the said input and clock pulses and for rendering the transistor conductive only when pulses of both kinds are present together, the transistor being rendered non-conductive again on the completion of either or both such pulses.

Preferably, the clock pulses are co-extensive with approximately the last forty percent of the corresponding time periods.

An electric circuit arrangement embodying an electric pulse delay and regeneration circuit according to the present invention will now be described by way of example and with reference to the accompanying drawings in which.

Figure 1:
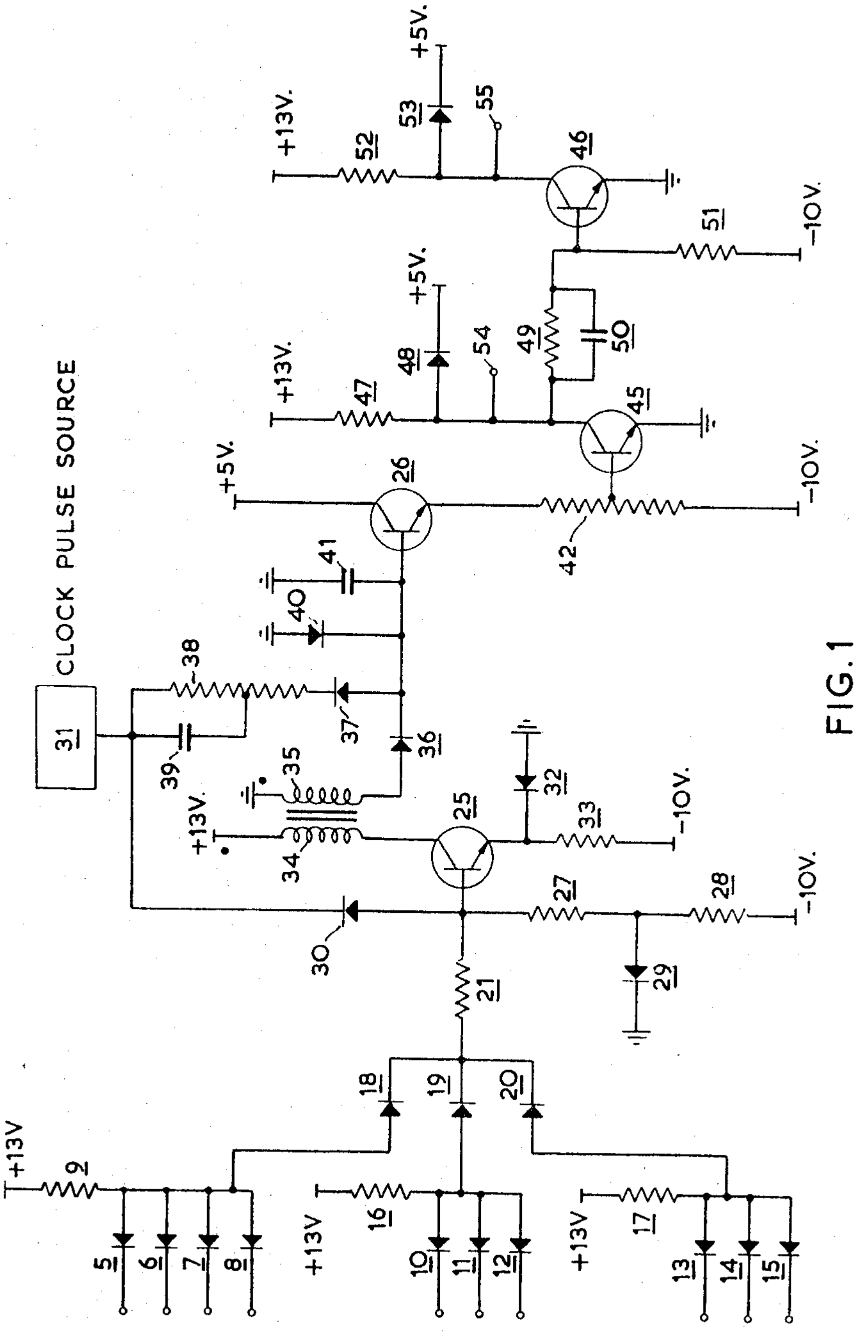
FIG. 1 shows diagrammatically the electric circuit arrangement.

The electric circuit arrangement consists of three parts, a logic stage, a delay stage, and finally an output stage.

The first stage comprises three AND gates and an OR gate. One of the AND gates has four inputs and comprises four diodes 5 to 8 connected in parallel with their positive terminals supplied from a +13 volt supply through a resistor 9. The other two AND gates have three inputs each, and include diodes 10 to 12 and 13 to 15 respectively. The diodes 10 to 12 are connected in parallel, with their positive terminals supplied by a +13 volt supply through a resistor 16, and the diodes 13 to 15 are similarly connected and supplied through a resistor 17.

The OR gate comprises three diodes 18 to 20, to the respective positive terminals of which the outputs of the three AND gates are connected. The negative terminals of the diodes 18 to 20 are connected together to a resistor 21.

The delay stage of the circuit includes an input transistor 25 and an output transistor 26. The base of the transistor 25 is connected to the resistor 21, and, through resistors 27 and 28, to a −10 volt supply. The junction of resistors 27 and 28 is connected to earth through a diode 29. The base of transistor 25 is also connected through a diode 30 to a source of clock pulses 31. The emitter of the transistor 25 is connected to earth through a diode 32 and to a −10 volt supply through a resistor 33. The collector of transistor 25 is connected through a primary winding 34 of a transformer to a +13 volt supply.

The secondary winding 35 of the transformer is connected at one end to earth and at the other end to a diode 36. The negative terminal of the diode 36 is connected to the base of transistor 26 and to three parallel circuits. The first of these three parallel circuits comprises a diode 37 connected in series through a resistor 38 to the source of clock pulses 31. A capacitor 39 is connected in parallel with part of the resistor 38. The second parallel circuit comprises a diode 40 connected to earth. The third parallel circuit comprises a capacitor 41 connected to earth, the capacitance of this capacitor being considerably less than that of capacitor 39.

The collector of the transistor 26 is connected to a +5 volt supply and the emitter is connected through a resistor 42 to a −10 volt supply. The transistor 26 is connected in emitter-follower configuration and provides the output of the second stage at a tapping on the resistor 42.

The output stage includes two transistors 45 and 46. The base of transistor 45 is connected to the tapping on the resistor 42 and its emitter is connected to earth. Its collector is connected to a +13 volt supply through a resistor 47 and to a +5 volt supply through a diode 48. The collector is also connected through a circuit consisting of a resistor 49 and a capacitor 50 to the base of transistor 46. The base of transistor 46 is also connected to a −10 v. supply through a resistor 51. The emitter of transistor 46 is directly connected to earth, while the collector is connected through a resistor 52 to a +13 volt supply and through a diode 53 to a +5 volt supply.

Terminals 54 and 55, connected respectively to the collectors of the transistors 45 and 46, provide "complement" and "true" outputs for the circuit arrangement.

The operation of the circuit will now be described with particular reference to FIG. 2.

The operation of the circuit is controlled by the clock pulses from source 31. The waveforms of three clock pulses I, II and III are shown at (b) in FIG. 2: the trailing edges of two consecutive clock pulses define a single time period. Each clock pulse lasts for 0.4 of a time period and has a magnitude of +5 volts: the remaining interval of each time period is termed the reset period and the level during this interval, the "reset interval," is −3 volts.

Referring to FIG. 1, it will be appreciated that if one or more of the inputs to one of the AND gates are at zero volts then the AND gate produces no output signal. If, however, all the inputs to an AND gate receive +5 volt pulses, then the AND gate will produce an output of +5 volts which is fed to the base of the transistor 25 through the appropriate diode 18–20 in the OR gate and the resistor 21. This +5 volt level is shown at (a) of FIG. 2 and represents an input signal to the delay stage of the circuit. The input signal is shown as a pulse lasting for one time period, termed the "input time period."

During the reset interval of each time period, transistor 25 is held cut off because its base is held negative at the reset level of −3 volts through the diode 30 which is biased into conduction. When the clock pulse occurs (clock pulse II), the diode 30 no longer conducts. In the absence of an input signal the transistor remains cut off. However, if an input signal is present, the resulting +5 volt level applied to the base of transistor 25 through the OR gate causes the transistor to conduct in the fully bottomed state during the clock pulse. Conduction of transistor 25 will, ignoring losses, apply +13 volts across the primary winding 34 of the transformer and the magnetising current therein will rise linearly as shown in (c) of FIG. 2. When transistor 25 is conducting, the diode 36 is cut off because its anode potential falls by +13 volts; its cathode cannot fall below zero volts because of diode 40 and its earth connection.

When the output from the source 31 falls again to the reset level of −3 volts the transistor 25 is cut off: at the time the transistor is cut off the current in the winding 34 has risen to 10 milliamps. When the transistor 25 ceases to conduct, the magnetising current in the primary winding 34 can no longer flow and, instead, the energy stored in the transformer magnetic field by the current which flowed in the winding 34 causes an equivalent current to flow in the secondary winding 35 through the diode 36 which is no longer cut off. This current flows partly through diode 37 to the clock pulse source 31, partly into capacitor 41 and partly into the base of transistor 26. The capacitor 39 acts for a short time as a virtual short-circuit across part of resistor 38 but is rapidly charged so that the full value of resistor 38 is effective to prevent too rapid a flow of current from the winding 35 to the source 31.

The current flowing in the capacitor 41 rapidly charges it until it applies a potential of +5 volts to the base of the transistor 26 and at this point transistor 26 is rendered conductive in the fully bottomed state. The current flowing in the secondary winding 35 is maintained for a sufficiently long period (but less than a time period) as shown in (d) of FIG. 2 for transistor 26 to remain bottomed throughout the reset interval following clock pulse II. The time period during part of which the current in the secondary winding flows is termed the output time period.

Figure 2:
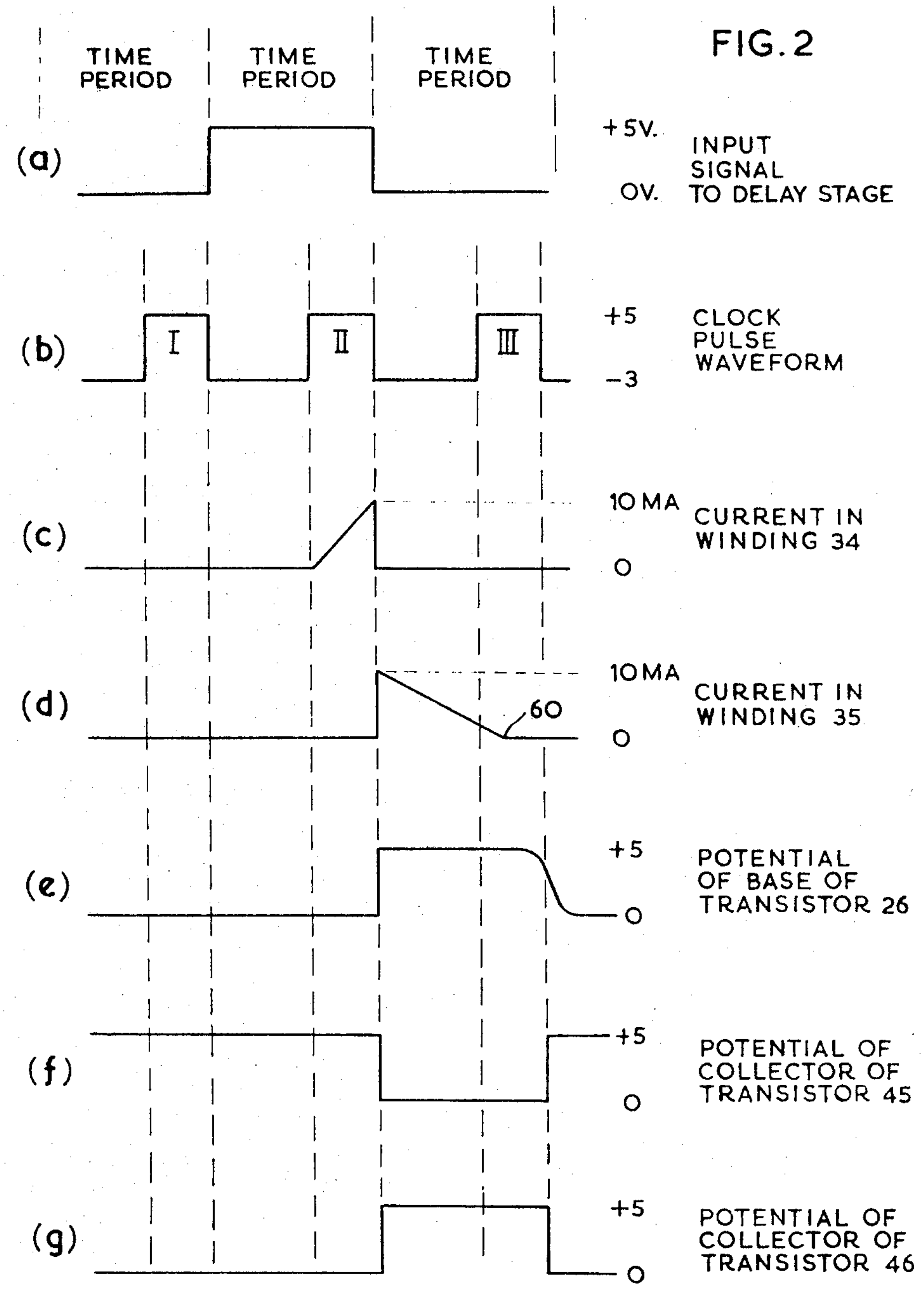
FIG. 2 shows to a time scale the manner in which various electric quantities in the circuit arrangement vary.

When the next clock pulse occurs (clock pulse III) the current flowing from the secondary winding through diode 37 is cut off and all the current flows into the base of transistor 26 until at a point 60 (see waveform (d) of FIG. 2) it has decayed to zero. During the remainder of the clock pulse III, the transistor 26 is maintained in the bottomed state solely by the charge on the capacitor 41. The waveform (e) in FIG. 2 shows the potential on the base of transistor 26 and indicates how the potential starts to fall as the charge on a capacitor 41 is reduced.

When the next reset interval occurs, following clock pulse III, capacitor 41 is rapidly discharged through diode 37 and resistor 38 towards −3 volts, though it is held at zero volts by the diode 40. In order to cut off transistor 26 as quickly as possible, as is necessary in order to achieve a sharp edge to the output pulse from the circuit, capacitor 41 must be allowed to discharge as rapidly as possible. Capacitor 39, which has a much larger capacitance than capacitor 41, assists in this by providing a virtual short circuit across part of resistor 38.

The transistor 26 is, as already stated, arranged in the emitter-follower configuration with respect to transistor 45. Whilst transistor 26 is conducting, a positive potential is applied to the base of transistor 45 causing it to conduct so that its collector potential, normally held at +5 volts through the diode 48 when the transistor is in the cut off state, falls to zero volts as shown in waveform (f) of FIG. 2. When transistor 26 is cut off at the end of clock pulse III, the transistor 45 is cut off again. When transistor 45 is conducting, the fall in its collector potential to zero volts is applied to the base of transistor 46 through resistor 49 and capacitor 50 and the transistor 46 is cut off. Its collector potential rises from zero and is held at +5 volts through diode 53 as shown in waveform (g) of FIG. 2. Thus, two outputs, true and complementary, are produced at terminals 55 and 54 respectively in response to the input pulse shown in (a) of FIG. 2. The two output pulses have the same magnitude and duration as the input pulse but are delayed by one time period. For an input signal lasting for several time periods, the true output from terminal 55 would be identical to the input signal, except for starting and finishing one time period later, and the complementary output would be an inverted version of the true output.

The resistor 33 and the diode 32 prevent the current in the primary winding 34 from rising above 10 milliamps if input signals are present during each time period so that the transistor 25 is repeatedly switched on during each clock pulse. In the absence of the resistor 33 and diode 32, the current in the winding 34 would build up continuously until prevented by the gain in the transitstor since it does not fall to zero between consecutive clock pulses.

Diode 29 conducts if two or more AND gates are producing outputs together and so prevents the potential of the base of transistor 25 from rising too far.

Though in the above-described circuit arrangement the transformer action occurring between the windings 34 and 35 transfers the energy from the energy receiving circuit 34 into the energy dissipating circuit 36, 26, in another circuit arrangement according to the present invention the transformer 34, 35 is replaced by an inductor having a magnetic core which carries the winding 34 only, and the collector of the transistor 25 is capacitively coupled with the diode 36. In this other circuit arrangement this capacitive coupling constitutes the means for transferring the energy from the magnetic field of the inductor into the energy dissipating circuit 36, 26.

The transistor 26 and its emitter load resistor 42 in the above-described circuit arrangement constitute a suitable means for setting the actual potential values of the output pulses produced by the delay stage, though in fact the collector potential (+5 volts) determines the upper level, whilst the diode 40 and its earth connection determine the lower level. However, in an alternative circuit arrangement according to the present invention the transistor 26 is replaced by a diode which performs the limiting function of the base-collector junction of the transistor 26, and the output is taken from the junction of the diode 36 with the diode 40 and capacitor 41.

What we claim as our invention and desire to secure by Letters Patent is:

1. An electric pulse delay circuit including an inductive device having an input circuit for receiving electric current from a supply source to establish a magnetic flux in the device and an output circuit for delivering electric current when the magnetic flux in the device changes, and a controllable switching means connected in circuit with the said input circuit for controlling the supply of electric current from the supply source to the inductive device, the switching means having a control circuit for receiving input pulses, characterised in that the output circuit includes a diode for enabling that circuit to deliver output current to an output connection only when the magnetic flux in the inductive device collapses, that a clock pulse source is connected through a first diode to the control circuit of the switching means to inhibit the response of the switching means to input pulses and thereby the establishment of magnetic flux in the inductive device except in the presence of a clock pulse and through a second diode to the said output connection to receive current from the output connection during the collapse of magnetic flux in the device in the absence of a clock pulse, that the output connection is connected to a source of potential intermediate the two potential levels of the clock pulse source (a) through a first capacitor to store energy during the said collapse of the magnetic flux, and (b) through a potential clamping diode to clamp the output connection at an output signal lower level in the absence of current from the output circuit of the inductive device, that the output connection is connected through a second clamping diode to a clamping potential source to clamp the output connection at an output signal upper level during the delivery of current from the output circuit of the inductive device, and that the clock pulse source is arranged to supply clock pulses each of which extends through the later part only of an input signal time period, and each of which is effective to cause the switching means to connect the input circuit with the supply source whenever an input pulse is simultaneously present at the control circuit.

2. An electrical pulse delay circuit according to claim 1, characterised in that the said second clamping diode is constituted by the base-collector junction of a transistor having its collector connected to the said source of clamping potential, an emitter load connected to its emitter, and an output tapping connected with the emitter circuit so formed.

3. An electrical pulse delay circuit according to claim 1, characterised in that the clock pulse source is connected to the output connection through a resistor connected in series with said second diode, and that a second capacitor is connected across a part of the resistor, this second capacitor having a substantially greater capacitance than said first capacitor.

4. An electrical pulse delay circuit according to claim 2, characterised in that the clock pulse source is connected to the output connection through a resistor connected in series with said second diode, and that a second capacitor is connected across a part of the resistor, this second capacitor having a substantially greater capacitance than said first capacitor.

5. An electrical pulse delay circuit according to claim 1, characterised in that the controllable switching means comprises a transistor having its collector connected with the input circuit of the inductive device, an emitter load connected to its emitter, and a potential clamping diode connecting the emitter with the said source of intermediate potential whereby to limit the rise in current supplied to the inductive device.

6. An electrical pulse delay circuit according to claim 2, characterized in that the controllable switching means comprises a transistor having its collector connected with the input circuit of the inductive device, an emitter load connected to its emitter, and a potential clamping diode connecting the emitter with the said source of intermediate potential whereby to limit the rise in current supplied to the inductive device.

7. An electrical pulse delay circuit according to claim 3, characterised in that the controllable switching means comprises a transistor having its collector connected with the input circuit of the inductive device, an emitter load connected to its emitter, and a potential clamping diode connecting the emitter with the said source of intermediate potential whereby to limit the rise in current supplied to the inductive device.

8. An electrical pulse delay circuit according to claim 4, characterised in that the controllable switching means comprises a transistor having its collector connected with the input circuit of the inductive device, an emitter load connected to its emitter, and a potential clamping diode connecting the emitter with the said source of intermediate potential whereby to limit the rise in current supplied to the inductive device.

References Cited

UNITED STATES PATENTS

| | | | |
|---|---|---|---|
| Re. 23,699 | 8/1953 | Havens | 328—55 |
| 2,910,583 | 10/1959 | Toner | 328—55 |
| 3,026,427 | 3/1962 | Chisholm | 328—164 |

FOREIGN PATENTS

| | | |
|---|---|---|
| 801,781 | 9/1958 | Great Britain. |

ARTHUR GAUSS, Primary Examiner

S. D. MILLER, Assistant Examiner

U.S. Cl. X.R.

307—208, 237, 269, 293; 328—164